United States Patent
Minamoto

(10) Patent No.: US 10,951,228 B2
(45) Date of Patent: Mar. 16, 2021

(54) SEMICONDUCTOR APPARATUS

(71) Applicant: ROHM CO., LTD., Kyoto (JP)

(72) Inventor: Kohta Minamoto, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 84 days.

(21) Appl. No.: 16/261,993

(22) Filed: Jan. 30, 2019

(65) Prior Publication Data

US 2019/0238153 A1 Aug. 1, 2019

(30) Foreign Application Priority Data

Feb. 1, 2018 (JP) .............................. JP2018-016510
Dec. 14, 2018 (JP) .............................. JP2018-234474

(51) Int. Cl.
| | | |
|---|---|---|
| *H03M 1/10* | (2006.01) | |
| *H03M 3/00* | (2006.01) | |
| *G06F 1/14* | (2006.01) | |
| *G06F 1/3287* | (2019.01) | |
| *G06F 3/05* | (2006.01) | |
| *G06F 1/3212* | (2019.01) | |

(52) U.S. Cl.
CPC ................ *H03M 3/38* (2013.01); *G06F 1/14* (2013.01); *G06F 1/3212* (2013.01); *G06F 1/3287* (2013.01); *G06F 3/05* (2013.01)

(58) Field of Classification Search
CPC .... H03M 1/0836; H03M 1/125; H03M 1/462; H03M 3/364; H03M 3/43; H03M 3/448; H03M 3/452
USPC ................................................. 341/118–121
See application file for complete search history.

(56) References Cited

U.S. PATENT DOCUMENTS

| | | | | |
|---|---|---|---|---|
| 6,522,983 B1 * | 2/2003 | Dobos | .................... | G01R 13/02 356/5.08 |
| 6,593,870 B2 * | 7/2003 | Dummermuth | ....... | H03M 3/368 341/143 |
| 8,368,570 B2 * | 2/2013 | Rysinski | ............. | H03M 1/1019 341/118 |
| 8,786,483 B1 * | 7/2014 | Thompson | .......... | H03M 1/0836 341/161 |
| 2009/0166513 A1 * | 7/2009 | Abe | .................... | H04N 5/23241 250/208.1 |
| 2010/0207800 A1 * | 8/2010 | Heo | ........................ | H03M 1/50 341/155 |
| 2012/0032824 A1 * | 2/2012 | Yoshioka | .............. | H03M 1/125 341/110 |
| 2012/0068866 A1 * | 3/2012 | Robinson | ............ | H03M 1/0836 341/118 |
| 2013/0154672 A1 * | 6/2013 | Fabregas | .............. | G01R 35/005 324/713 |
| 2014/0070895 A1 * | 3/2014 | Chindo | .................. | H03B 17/00 331/94.1 |
| 2014/0266825 A1 * | 9/2014 | Li | ......................... | H03M 3/384 341/120 |
| 2018/0054162 A1 * | 2/2018 | Pflum | ....................... | H03L 7/00 |

FOREIGN PATENT DOCUMENTS

JP 2014230012 A 12/2014

* cited by examiner

*Primary Examiner* — Linh V Nguyen

(74) *Attorney, Agent, or Firm* — Cantor Colburn LLP

(57) ABSTRACT

A semiconductor apparatus is used together with a processor. An A/D converter is configured to be calibratable. A logic circuit periodically supplies a calibration trigger to the A/D converter by means of a count operation using the output of an oscillator.

13 Claims, 5 Drawing Sheets

SEMICONDUCTOR APPARATUS

CROSS-REFERENCE TO RELATED APPLICATION

The present application claims priority under 35 U.S.C. § 119 to Japanese Patent Application No. 2018-016510, filed on Feb. 1, 2018 and Japanese Patent Application No. 2018-234474, filed on Dec. 14, 2018, the entirety of which is hereby incorporated by reference herein and forms a part of the specification.

BACKGROUND OF THE INVENTION

1. Field of the Invention

The present invention relates to a semiconductor apparatus including an A/D converter.

2. Description of the Related Art

In order to support digital signal processing for an electrical state of an internal circuit or a physical state of an electronic device, various kinds of electronic devices employ an A/D converter that converts an analog signal that indicates such a state into a digital signal.

FIG. 1 is a block diagram showing a semiconductor apparatus 10 including an A/D converter. The semiconductor apparatus 10 is mounted on an electronic device 2 together with a processor 4. The semiconductor apparatus 10 includes an A/D converter 12, a logic circuit 14, and an interface circuit 16.

The A/D converter 12 converts an analog signal A1, which is input from an external circuit or otherwise generated in an internal circuit of the semiconductor apparatus 10, into a digital signal D1. The logic circuit 14 processes the digital signal D1. As a result of the processing, the processed data D2 is stored in a register, which allows the processor 4 to access the data D2 via the interface circuit 16.

In a usage that requires the A/D converter 12 to have high resolution, an offset amount due to temperature fluctuation has a large effect on the conversion results thereof. In order to solve such a problem, upon receiving a calibration instruction from the processor 4, the logic circuit 14 instructs the A/D converter 12 to execute a calibration operation.

For example, the processor 4 monitors the temperature. With the occurrence of unallowable temperature fluctuation as a condition, the processor 4 outputs a calibration instruction to the semiconductor apparatus 10.

With the circuit system shown in FIG. 1, the processor 4 is required to always monitor the temperature regardless of the operation status of the electronic device 2. Accordingly, such an arrangement involves a problem in that the processor 4 cannot be suspended (be set to a sleep mode, suspension mode, or standby mode). This becomes a bottleneck in providing low power consumption.

SUMMARY OF THE INVENTION

The present invention has been made in order to solve such a problem. Accordingly, it is an exemplary purpose of an embodiment of the present invention to provide a semiconductor apparatus that provides a system with low power consumption.

An embodiment of the present invention relates to a semiconductor apparatus to be used together with a processor. The semiconductor apparatus comprises: an oscillator; an A/D converter structured to be calibrated; and a logic circuit structured to periodically supply a calibration trigger to the A/D converter by means of a count operation using an output of the oscillator.

Another embodiment of the present invention relates to a power management circuit. The power management circuit comprises: a power supply circuit structured to receive a voltage from a battery, and to generate a power supply voltage to be supplied to a processor; an A/D converter structured to convert a current that flows through the battery into a digital value, and to be calibratable; a real time clock circuit structured to always operate; and a logic circuit structured to execute a count operation using an output of the real time clock circuit, to supply an A/D conversion trigger to the A/D converter with a first period, and to supply the calibration trigger to the A/D converter with a second period that is longer than the first period.

It is to be noted that any arbitrary combination or rearrangement of the above-described structural components and so forth is effective as and encompassed by the present embodiments. Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

Figure 1:
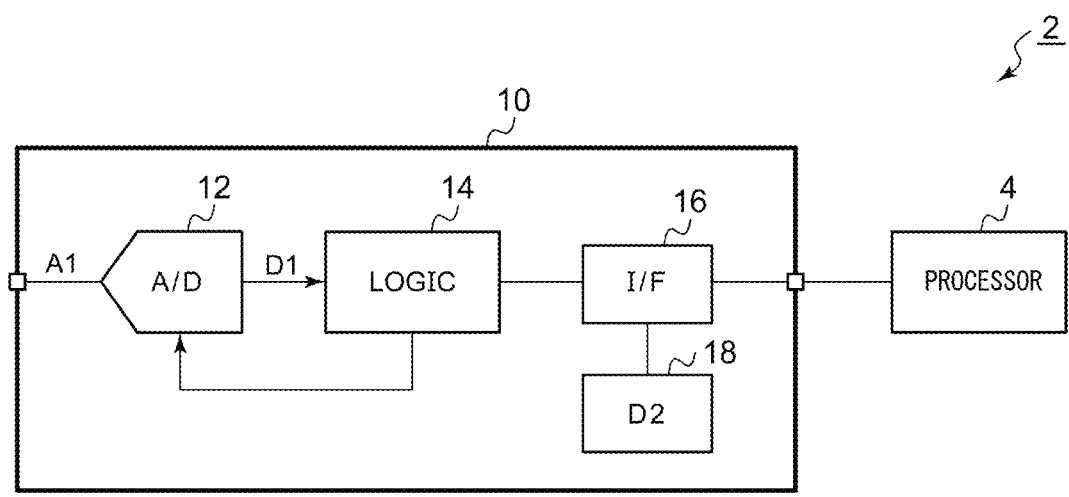
FIG. 1 is a block diagram showing a semiconductor apparatus including an A/D converter.

The invention will now be described based on preferred embodiments which do not intend to limit the scope of the present invention but exemplify the invention. All of the features and the combinations thereof described in the embodiment are not necessarily essential to the invention.

Overview of Embodiments

An embodiment disclosed in the present specification relates to a semiconductor apparatus. The semiconductor apparatus is used together with a processor. The semiconductor apparatus comprises: an oscillator structured to always oscillate; an A/D converter structured to be calibrated; and a logic circuit structured to periodically supply a calibration trigger to the A/D converter by means of a count operation using an output of the oscillator.

With this embodiment, the A/D converter is periodically calibrated using the oscillator built into the semiconductor apparatus itself. This arrangement does not require the processor to judge whether or not a calibration condition has been satisfied. Accordingly, in a situation in which there is no required operation supported by the processor, this arrangement is able to suspend the processor, thereby allowing power consumption to be reduced.

Also, the logic circuit may receive a timing signal having a predetermined period based on the output of the oscillator. Also, the logic circuit may supply an A/D conversion trigger to the A/D converter according to the timing signal. Also, the logic circuit may supply the calibration trigger to the A/D converter every time the count value of the timing signal reaches a predetermined number. By controlling both the A/D conversion operation and the calibration based on a common signal, this arrangement provides a simple circuit configuration.

Also, the predetermined number may be settable. This allows the calibration frequency to be optimized according to the usage of the semiconductor apparatus.

Also, the semiconductor apparatus may further comprise an RTC (Real Time Clock) circuit. Also, the timing signal may be generated by the RTC circuit. The RTC circuit always operates with very low power consumption. Accordingly, the output of the RTC circuit is preferably used to periodically generate the calibration trigger.

Also, the semiconductor apparatus may be coupled to a battery for a device that comprises the semiconductor apparatus as a built-in component. Also, the A/D converter may be structured to convert a current that flows through the battery into a digital value. Also, the semiconductor apparatus may integrate the digital value. This allows the remaining battery charge to be detected.

Also, the semiconductor apparatus may further comprise a power supply circuit structured to supply a power supply voltage to the processor. Also, when the processor comes to be in a suspension state, the power supply circuit may suspend the supply of the power supply voltage.

Also, the A/D converter may be structured as a delta-sigma A/D converter.

Embodiments

Description will be made below regarding preferred embodiments according to the present invention with reference to the drawings. The same or similar components, members, and processes are denoted by the same reference numerals, and redundant description thereof will be omitted as appropriate. The embodiments have been described for exemplary purposes only, and are by no means intended to restrict the present invention. Also, it is not necessarily essential for the present invention that all the features or a combination thereof be provided as described in the embodiments.

In the present specification, the state represented by the phrase "the member A is coupled to the member B" includes a state in which the member A is indirectly coupled to the member B via another member that does not substantially affect the electric connection between them, or that does not damage the functions or effects of the connection between them, in addition to a state in which they are physically and directly coupled. Similarly, the state represented by the phrase "the member C is provided between the member A and the member B" includes a state in which the member A is indirectly coupled to the member C, or the member B is indirectly coupled to the member C via another member that does not substantially affect the electric connection between them, or that does not damage the functions or effects of the connection between them, in addition to a state in which they are directly coupled.

Figure 2:
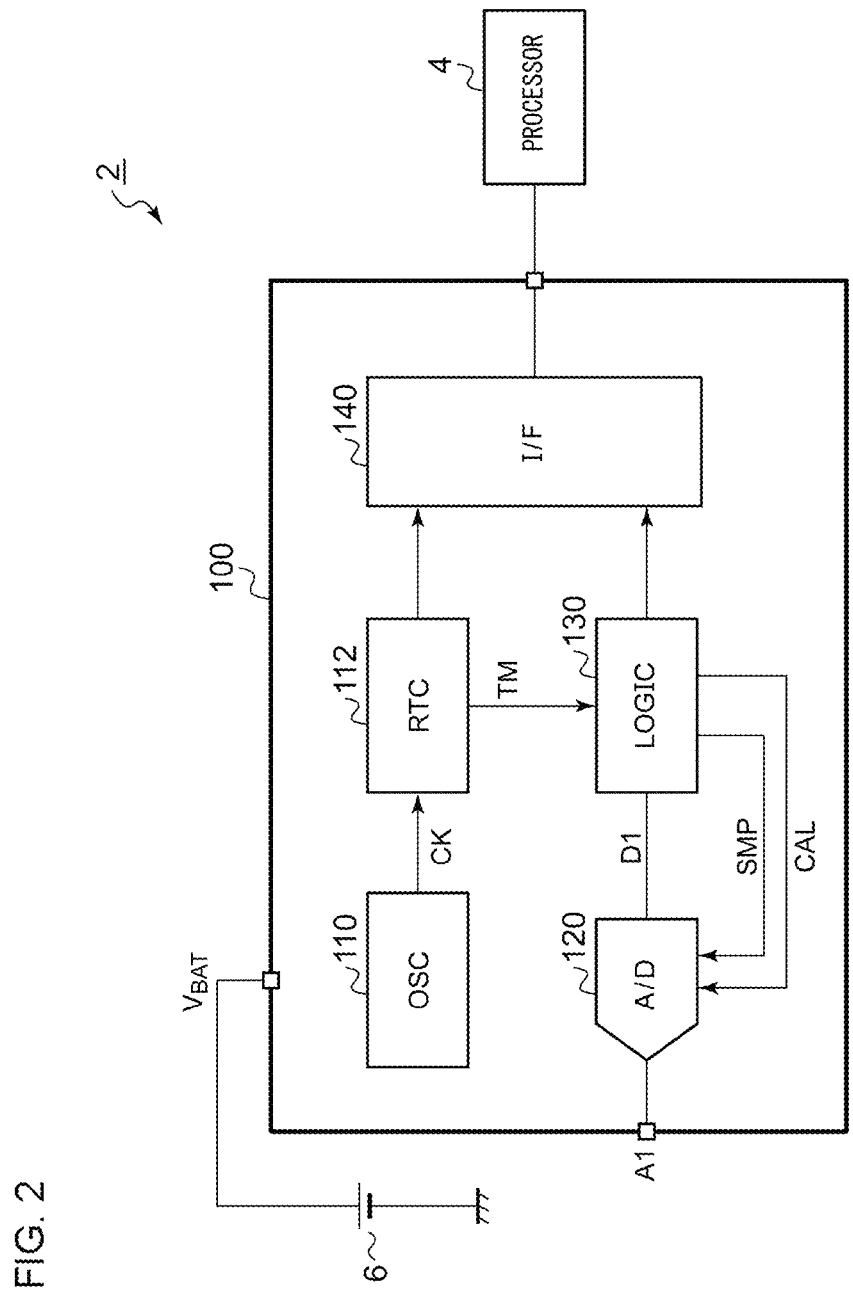
FIG. 2 is a block diagram showing an electronic device including a semiconductor apparatus according to an embodiment.

FIG. 2 is a block diagram showing an electronic device 2 including a semiconductor apparatus 100 according to an embodiment. The electronic device 2 further includes a processor 4 and a battery 6 in addition to the semiconductor apparatus 100. The kind of the electronic device 2 is not restricted in particular. For example, the electronic device 2 is configured as a device that is required to operate with low power consumption, examples of which include smartphones, tablet terminals, wearable terminals, electronic books, and fire alarms.

The semiconductor apparatus 100 includes an oscillator 110, an A/D converter 120, a logic circuit 130, and an interface circuit 140, which are integrated on a single semiconductor substrate. The semiconductor apparatus 100 always receives a voltage $V_{BAT}$ from the battery 6 as a power supply. The battery 6 may be configured as either a primary battery or otherwise a secondary battery.

The oscillator 110 always oscillates, and generates a clock signal CK. The A/D converter 120 converts an analog signal A1 input from an external circuit into a digital signal D1. The A/D converter 120 may operate with an internal signal of the semiconductor apparatus 10 as an input signal.

The logic circuit 14 processes the digital signal D1. As a result of the processing, the processed data D2 is stored in the register, which allows the processor 4 to access the data D2 via the interface circuit 140.

The A/D converter 120 is configured to be calibrated. For example, in the calibration mode, the input of the A/D converter 120 is fixed, and the output in this state is acquired as an offset signal. In a case in which the A/D converter 120 has a differential input configuration, the two inputs are short-circuited, and the output in this state is acquired. The calibration method for such an A/D converter may preferably be selected according to the A/D converter method.

The logic circuit 130 asserts a calibration signal CAL at regular intervals (calibration period $T_{CAL}$) by means of a count operation using the output CK of the oscillator 110, so as to periodically supply a calibration trigger to the A/D converter 120. Furthermore, the logic circuit 130 asserts a sampling signal SMP with a sampling period $T_S$ (first period) that is shorter than the calibration period (which will be referred to as the "second period"), so as to supply an A/D conversion instruction to the A/D converter 120.

Preferably, the semiconductor apparatus 100 includes an RTC circuit 112, which provides a time clock function or a calendar function. The RTC circuit 112 continuously updates the current time point or current date. The processor 4 is allowed to access such time data or date data via the interface circuit 140.

The RTC circuit 112 is capable of generating a signal (which will be referred to as a "timing signal") TM that is asserted every second. Accordingly, the logic circuit 130 may generate the sampling period and the calibration period using the timing signal TM. For example, the sampling period may be generated to be the same as the period of the timing signal TM (i.e., 1 second). Also, the calibration period may be generated to be a predetermined number N times the period of the timing signal TM. The number N may preferably be configured as a parameter that can be set via an external circuit. In this case, the calibration signal CAL may be calibrated by means of a counter that counts the timing signal TM.

Figure 3:
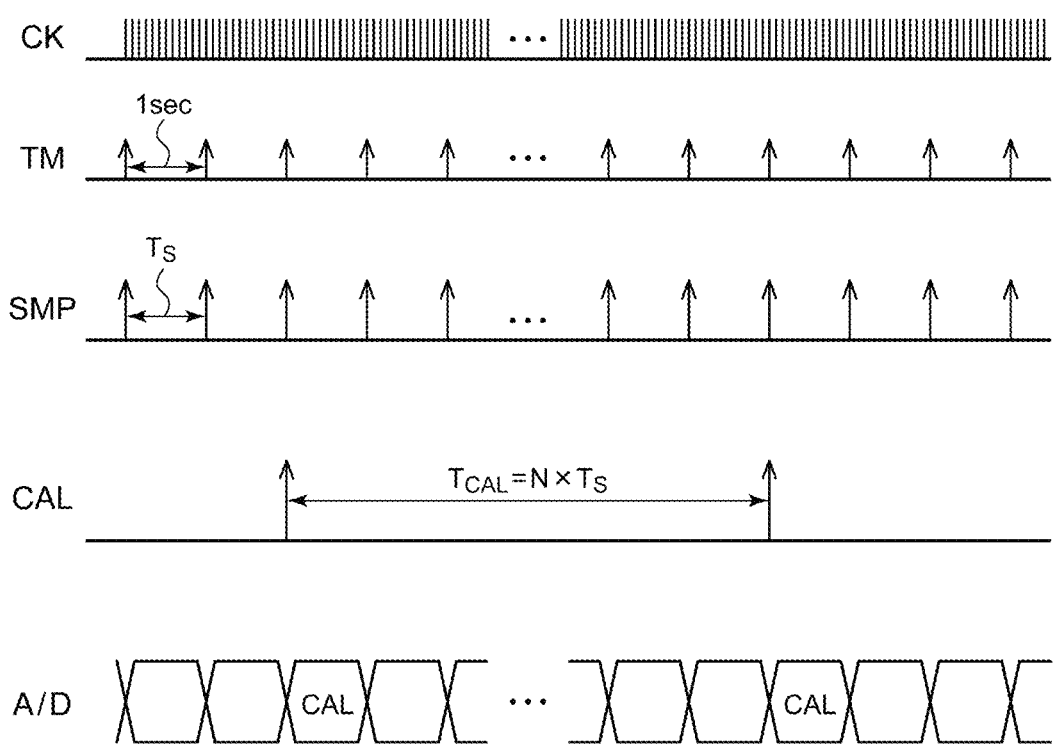
FIG. 3 is a time chart for explaining the operation of the semiconductor apparatus shown in FIG. 2.

The above is the configuration of the semiconductor apparatus 100. Next, description will be made regarding the operation thereof. FIG. 3 is a time chart for explaining the operation of the semiconductor apparatus 100 shown in FIG. 2. The A/D converter 120 converts the analog signal A1 into a digital value in response to the sampling signal SMP that is asserted for every predetermined sampling period $T_S$. Furthermore, the A/D converter 120 is set to the calibration mode in response to the calibration signal CAL that is asserted for every predetermined calibration period $T_{CAL}$. In the calibration mode, the A/D converter 120 outputs a digital value that is required for calibration.

The above is the operation of the semiconductor apparatus 100. The semiconductor apparatus 100 periodically executes calibration of the A/D converter 120 using the oscillator 110 built into the semiconductor apparatus 100 itself. This arrangement does not require the external processor 4 to judge a calibration condition (e.g., this arrangement does not require temperature monitoring). Accordingly, this arrangement allows the processor 4 to be suspended in a situation in which there is no processing to be supported by the processor 4, e.g., when the operation of the electronic device 2A is suspended.

It should be noted that the logic circuit 130 may always generate the calibration signal CAL regardless of whether or not the operation of the processor 4 is suspended. In this case, the processor 4 side is not required to support particular processing or to be provided with a particular built-in circuit in order to judge the calibration condition, which is an advantage.

Figure 4:
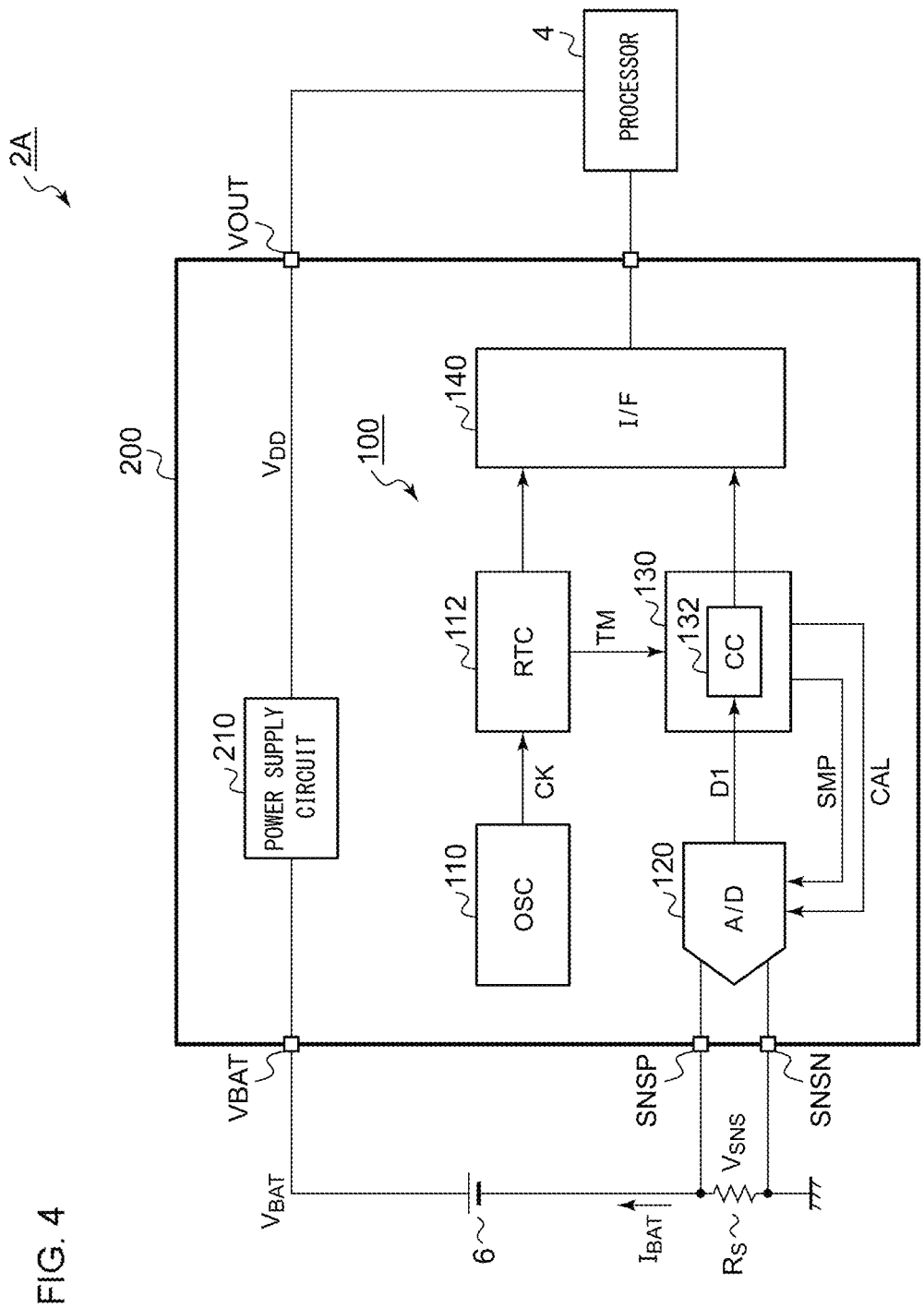
FIG. 4 is a block diagram showing a power management circuit.

Next, description will be made regarding the usage of the semiconductor apparatus 100. The architecture of the semiconductor apparatus 100 is preferably employed in a power management circuit. FIG. 4 is a block diagram showing a power management circuit 200. The power management circuit 200 is built into the electronic device 2A together with the processor 4 and the battery 6.

The power management circuit 200 is configured as an IC (Integrated Circuit) that supports management of a supply of power for the electronic device 2A.

The power management circuit 200 further includes a power supply circuit 210 in addition to the same circuit blocks (110, 112, 120, 130, 140) as those of the above-described semiconductor apparatus 100. The power supply circuit 210 includes a DC/DC converter or a linear regulator, receives a battery voltage $V_{BAT}$, and generates a power supply voltage $V_{DD}$ stabilized to a predetermined voltage level. The power supply voltage $V_{DD}$ is supplied to the processor 4 via a voltage output terminal (VOUT).

The power management circuit 200 may include multiple power supply circuits each supplying a power supply voltage to a corresponding load that differs from the processor 4. However, this configuration is not relevant to the present invention, and accordingly, this configuration is not shown.

The power management circuit 200 is provided with a function for detecting the remaining battery charge (fuel gauge). Examples of such a remaining battery charge detection method include the coulomb count method in which the current $I_{BAT}$ that flows through the battery 6 is integrated. The power management circuit 200 detects the charge amount that flows from the battery 6 based on the coulomb count method.

The A/D converter 120 is used to detect the current that flows through the battery 6. A sensing resistor Rs is coupled in series with the battery 6. A voltage drop $V_{SNS}$ occurs across the sensing resistor Rs in proportion to the battery current $I_{BAT}$. The voltage drop $V_{SNS}$ is input to sensing terminals SNSP and SNSN of the power management circuit 200. The A/D converter 120 converts the voltage drop $V_{SNS}$ into a digital value D1. The A/D converter 120 may be configured as a delta-sigma A/D converter, for example.

The logic circuit 130 includes a coulomb counter circuit 132 that integrates the digital values D1 that represent the current values. The logic circuit 130 generates a coulomb count value CC. The processor 4 is allowed to access the coulomb count value CC. The coulomb counter circuit 132 may be configured as an accumulator including memory and an adder.

The input stage of the A/D converter 120 may be provided with a sensing amplifier that amplifies a minute voltage drop.

In a case in which the battery 6 is configured as a secondary battery, a charger circuit is further integrated together with the power management circuit 200.

The above is the configuration of the power management circuit 200. By employing the architecture of the semiconductor apparatus 100, this arrangement allows the power management circuit 200 itself to periodically calibrate the A/D converter 120. Accordingly, this arrangement is able to suspend the processor 4 when the electronic device 2A is suspended, thereby allowing the power consumption to be reduced.

Furthermore, when the processor 4 comes to be in the suspension state, this arrangement allows the power management circuit 200 to suspend the supply of the power supply voltage $V_{DD}$. That is to say, this arrangement is able to suspend the operation of the power supply circuit 210. Accordingly, this arrangement allows the power consumption of the power management circuit 200 to be further reduced.

Description has been made above regarding the present invention with reference to the embodiments. The above-described embodiments have been described for exemplary purposes only, and are by no means intended to be interpreted restrictively. Rather, it can be readily conceived by those skilled in this art that various modifications may be made by making various combinations of the aforementioned components or processes, which are also encompassed in the technical scope of the present invention. Description will be made below regarding such modifications.

First Modification

Figure 5:
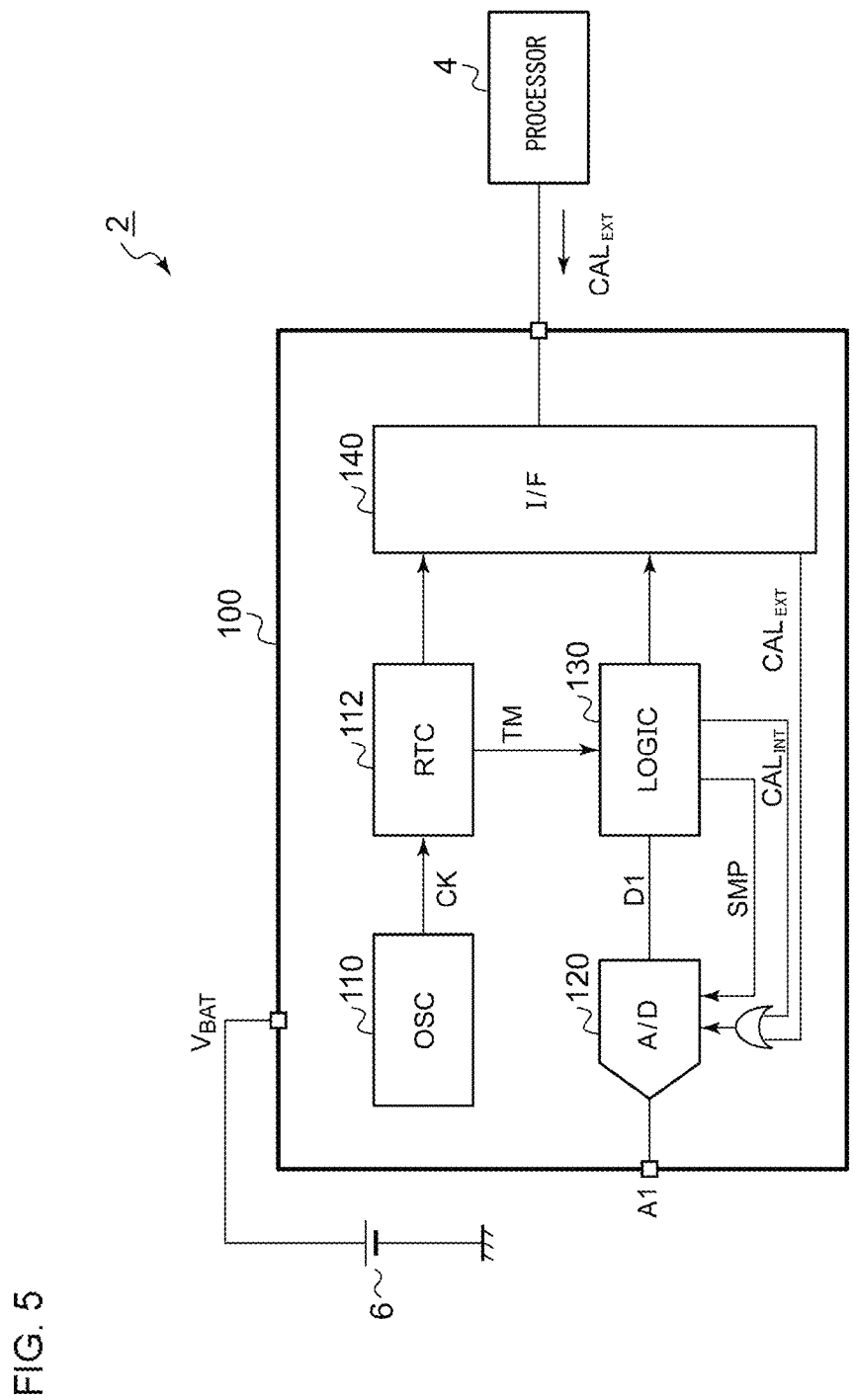
FIG. 5 is a block diagram showing an electronic device including a semiconductor apparatus according to a first modification.

FIG. 5 is a block diagram showing an electronic device including a semiconductor apparatus according to a first modification. In the first modification, the logic circuit 130 may generate the calibration signal CAL (internal calibration signal $CAL_{INT}$) only when the processor 4 comes to be in the sleep state. In this modification, during a period in which the processor 4 is in the waking state, the processor 4 judges whether or not a calibration condition is satisfied. When judgment has been made that the calibration condition is satisfied, the processor 4 supplies a calibration trigger (external calibration signal $CAL_{EXT}$) to the semiconductor apparatus 100.

The external calibration signal $CAL_{EXT}$ is input to the A/D converter 120 via the interface circuit 140. The A/D converter 120 may be configured to receive the logical OR of the external calibration signal $CAL_{EXT}$ and the internal calibration signal $CAL_{INT}$. Alternatively, the external calibration signal $CAL_{EXT}$ may be input to the logic circuit 130 via the interface circuit 140. In this case, the logic circuit 130 may supply a calibration instruction to the A/D converter 120.

In many applications, the processor 4 is capable of acquiring information with respect to various kinds of parameters (operation conditions) such as temperature that differs from time. Accordingly, the processor 4 is capable of setting a timing at which the A/D converter 120 is to be calibrated, giving consideration to parameters that differ from time. This arrangement provides more appropriate calibration as compared with an arrangement in which the calibration timing is determined based on only the internal calibration signal $CAL_{INT}$.

Second Modification

The lengths of the calibration period $T_{CAL}$ and the sampling period $T_S$ and the generating method for the calibration signal CAL and the sampling signal SMP have been described for exemplary purposes only. Such lengths and the generating method may preferably be determined according to the monitoring target for the A/D converter or the usage of the semiconductor apparatus 100.

The sampling period Ts may be set to M seconds (M<N). In this case, the sampling signal SMP may be generated by means of a counter configured to count the timing signal that is asserted every second.

In a case in which the calibration period $T_{CAL}$ is set to 60 seconds (one minute), the timing signal provided by the RTC circuit 112, which is asserted every minute, may be employed as the calibration signal CAL. Also, in a case in which the calibration period $T_{CAL}$ is set to N minutes, such an arrangement may count the timing signal that is asserted every minute. In a case in which a value to be monitored gradually changes as is the case with temperature, the sampling period $T_S$ may be set to N minutes.

Third Modification

The usage of the semiconductor apparatus 100 is not restricted to such a power management IC. For example, the A/D converter 120 may receive, as an input signal, an output of various kinds of sensing devices such as a temperature sensor.

While the preferred embodiments of the present invention have been described using specific terms, such description is for illustrative purposes only, and it is to be understood that changes and variations may be made without departing from the spirit or scope of the appended claims.

What is claimed is:

1. A semiconductor apparatus to be used together with a processor, the semiconductor apparatus comprising:
   an oscillator;
   an A/D converter structured to be calibrated; and
   a logic circuit structured to periodically supply a calibration trigger to the A/D converter by means of a count operation using an output of the oscillator,
   wherein, during suspension of the processor, the logic circuit generates the calibration trigger using the output of the oscillator,
   and wherein, during operation of the processor, the processor generates the calibration trigger for the A/D converter.

2. The semiconductor apparatus according to claim 1, wherein the logic circuit is coupled to receive a timing signal having a predetermined period based on the output of the oscillator,
   wherein the logic circuit is structured to supply an A/D conversion trigger to the A/D converter according to the timing signal,
   and wherein the logic circuit is structured to supply the calibration trigger to the A/D converter every time the count value of the timing signal reaches a predetermined number.

3. The semiconductor apparatus according to claim 2, wherein the predetermined number is settable.

4. The semiconductor apparatus according to claim 2, further comprising an Real Time Clock (RTC) circuit, wherein the timing signal is generated by the RTC circuit.

5. The semiconductor apparatus according to claim 1, coupled to a battery for a device that comprises the semiconductor apparatus as a built-in component,
   wherein the A/D converter is structured to convert a current that flows through the battery into a digital value,
   and wherein the semiconductor apparatus integrates the digital value.

6. The semiconductor apparatus according to claim 1, further comprising a power supply circuit structured to supply a power supply voltage to the processor.

7. The semiconductor apparatus according to claim 6, wherein, when the processor comes to be in a suspension state, the power supply circuit suspends the supply of the power supply voltage.

8. The semiconductor apparatus according to claim 1, wherein the A/D converter is structured as a delta-sigma A/D converter.

9. The semiconductor apparatus according to claim 1, monolithically integrated on a single semiconductor substrate.

10. A power management circuit comprising:
    a power supply circuit structured to receive a voltage from a battery, and to generate a power supply voltage to be supplied to a processor;
    an A/D converter structured to convert a current that flows through the battery into a digital value, and to be calibratable;
    an RTC (Real Time Clock) circuit structured to always operate; and
    a logic circuit structured to execute a count operation using an output of the RTC circuit, to supply an A/D conversion trigger to the A/D converter with a first period, and to supply the calibration trigger to the A/D converter with a second period that is longer than the first period.

11. The power management circuit according to claim 10, further comprising a coulomb counter circuit structured to integrate an output of the A/D converter.

12. The power management circuit according to claim 10, wherein, during suspension of the processor, the logic circuit generates the calibration trigger using the output of the RTC circuit
    and wherein, during operation of the processor, the processor generates the calibration trigger for the A/D converter.

13. An electronic device comprising the power management circuit according to claim 10.

* * * * *